(12) United States Patent
Dilley

(10) Patent No.: US 10,998,820 B2
(45) Date of Patent: May 4, 2021

(54) STACKED DC-DC CONVERTER

(71) Applicant: EPC Power Corporation, Poway, CA (US)

(72) Inventor: Devin Dilley, Lakeside, CA (US)

(73) Assignee: EPC Power Corporation, Poway, CA (US)

(*) Notice: Subject to any disclaimer, the term of this patent is extended or adjusted under 35 U.S.C. 154(b) by 0 days.

(21) Appl. No.: 16/548,426

(22) Filed: Aug. 22, 2019

(65) Prior Publication Data
US 2020/0067412 A1 Feb. 27, 2020

Related U.S. Application Data

(60) Provisional application No. 62/722,043, filed on Aug. 23, 2018.

(51) Int. Cl.
*H02M 3/158* (2006.01)
*H02M 3/335* (2006.01)
(Continued)

(52) U.S. Cl.
CPC ............. *H02M 3/1584* (2013.01); *H02J 1/10* (2013.01); *H02M 3/337* (2013.01);
(Continued)

(58) Field of Classification Search
CPC .. H02M 3/158; H02M 3/1582; H02M 3/1584; H02M 3/335; H02M 3/33507;
(Continued)

(56) References Cited

U.S. PATENT DOCUMENTS 7,180,763 B2 2/2007 Patwardhan et al.
8,193,864 B2 6/2012 Model
(Continued)

FOREIGN PATENT DOCUMENTS

DE 102016224310 A1 * 6/2018 ............... H02M 1/44
DE 102017202130 A1 * 8/2018 ......... H02M 3/33592
(Continued)

OTHER PUBLICATIONS

International Search Report and Written Opinion for International Application No. PCT/US2019/047726, dated Nov. 21, 2019, 12 pages.
(Continued)

*Primary Examiner* — Matthew V Nguyen
(74) *Attorney, Agent, or Firm* — Foley & Lardner LLP

(57) ABSTRACT

An illustrative embodiment described herein is a stacked direct current to direct current (DC-DC) converter including a first DC bus coupled to a first one of a power source and a power load and a second DC bus coupled to a second one of the power source and the power load. The stacked DC-DC converter includes a first half-bridge coupled to a first portion the first DC bus and a second half-bridge circuit coupled to a second portion the DC first bus. The stacked DC-DC converter includes a third half-bridge circuit coupled to a first portion of the second DC bus and a fourth half-bridge circuit coupled to a second portion of the second DC bus. The stacked DC-DC converter includes a first magnetic element coupling the first half-bridge circuit to the third half-bridge circuit and a second magnetic element coupling the second half-bridge circuit to the fourth half-bridge circuit.

18 Claims, 8 Drawing Sheets

(51) Int. Cl.
  *H03K 17/687* (2006.01)
  *H02M 3/337* (2006.01)
  *H02J 1/10* (2006.01)
  *H02M 7/483* (2007.01)

(52) U.S. Cl.
  CPC ...... *H02M 3/33507* (2013.01); *H03K 17/687* (2013.01); *H02M 2007/4835* (2013.01)

(58) Field of Classification Search
  CPC ......... H02M 3/337; H02M 2001/0074; H02M 2001/0077; H02M 2007/4835; H03K 17/687; H02J 1/10; H02J 1/102; H02J 1/14
  See application file for complete search history.

(56) References Cited

U.S. PATENT DOCUMENTS

| | | | |
|---|---|---|---|
| 8,472,223 B2 | 6/2013 | Truettner | |
| 9,584,034 B2 | 2/2017 | Deboy | |
| 9,991,795 B2* | 6/2018 | Dilley | H02M 3/158 |
| 2014/0042813 A1 | 2/2014 | Zilberberg et al. | |
| 2016/0329811 A1 | 11/2016 | Du et al. | |
| 2018/0054065 A1 | 2/2018 | Yang et al. | |
| 2018/0287498 A1* | 10/2018 | Yu | H02M 3/1584 |
| 2018/0331625 A1 | 11/2018 | Somani et al. | |
| 2018/0375465 A1* | 12/2018 | Ayyanar | H02M 7/4826 |
| 2019/0267898 A1* | 8/2019 | Elserougi | H02M 3/158 |

FOREIGN PATENT DOCUMENTS

| | | | | |
|---|---|---|---|---|
| EP | 2 768 130 | | 8/2014 | |
| JP | 2019067690 | * | 4/2019 | H02M 7/48 |

OTHER PUBLICATIONS

Sha et al., "Duty Cycle Exchanging Control for Input-Series-Output-Series Connected Two PS-FB DC-DC Converters" IEEE Transactions on Power Electronics, vol. 27, No. 3, Mar. 2012, pp. 1490-1501.

* cited by examiner

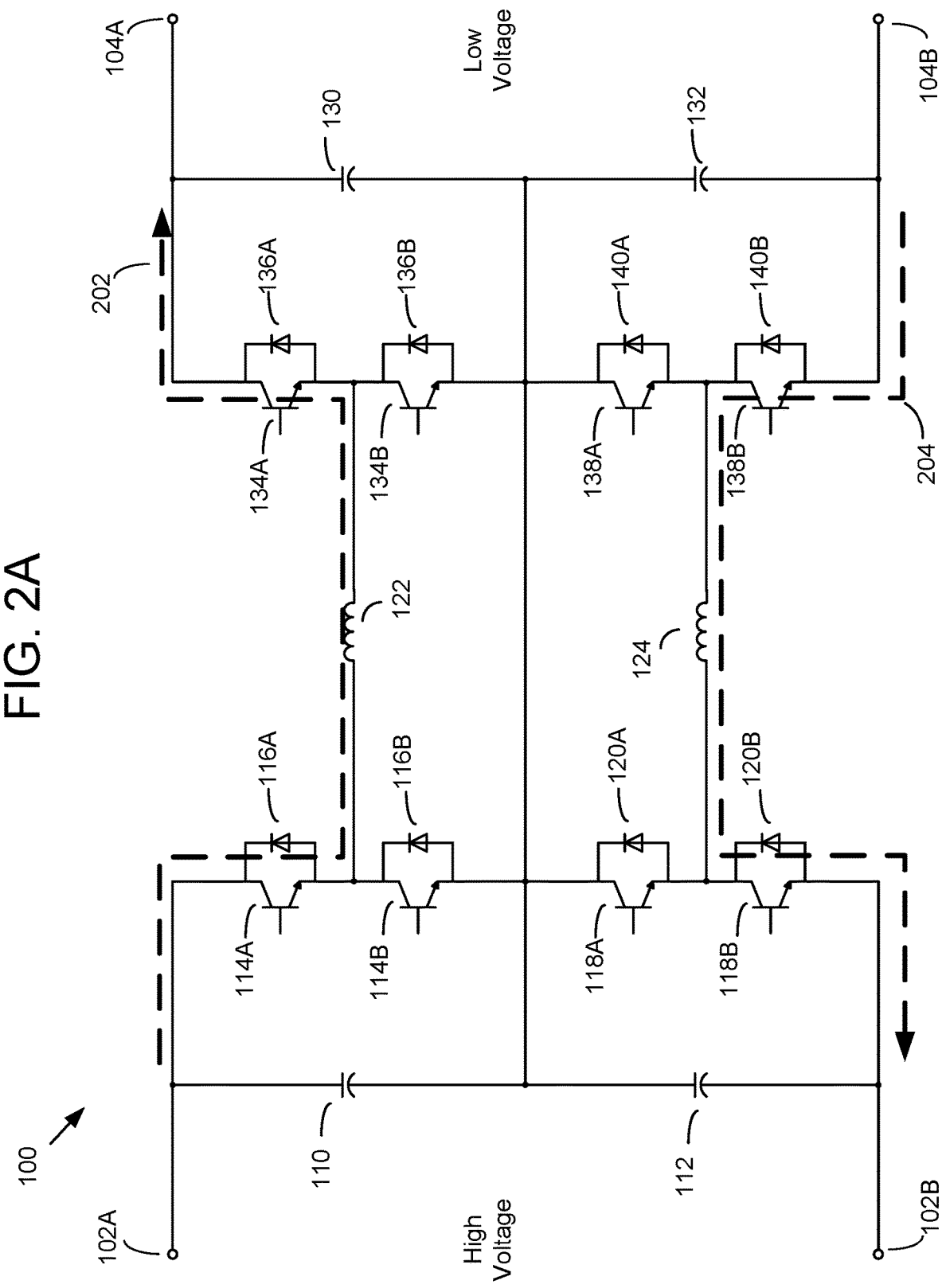

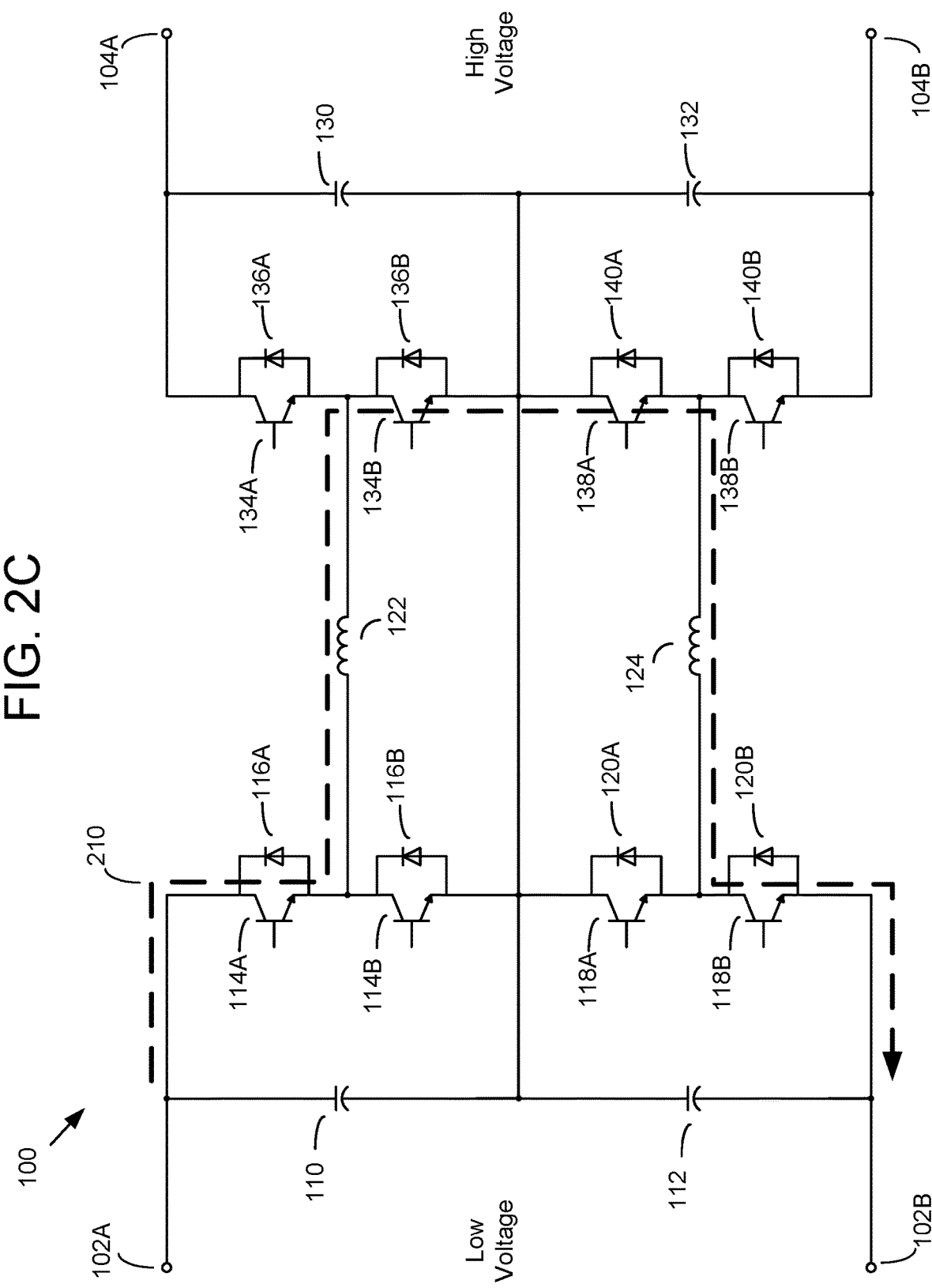

STACKED DC-DC CONVERTER

CROSS-REFERENCE TO RELATED APPLICATION

This application claims benefit of and priority to U.S. Provisional Application No. 62/722,043, filed Aug. 23, 2018, the content of which is hereby incorporated by reference in its entirety.

BACKGROUND

Recently, renewable energy such as solar, wind, and hydro has grown in demand. As part of some renewable energy infrastructures, a storage system stores the excess energy generated. However, the voltage levels at the respective interfaces of the energy generation system and the energy storage system are generally not the same. Thus, direct current to direct current (DC-DC) converters are a vital part of any renewable energy infrastructure.

Further details of aspects, objects, and advantages of the invention are described below in the detailed description, drawings, and claims. Both the foregoing general description and the following detailed description are exemplary and explanatory, and are not intended to be limiting as to the scope of the invention. Particular embodiments may include all, some, or none of the components, elements, features, functions, operations, or steps of the embodiments disclosed above. The subject matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

SUMMARY OF PARTICULAR EMBODIMENTS

Aspects of the present disclosure relate generally to direct current voltage conversion, and more particularly a novel stacked topology of non-isolated half-bridge pairs with separate dc busses.

An illustrative embodiment described herein is a stacked direct current to direct current (DC-DC) converter including a first DC bus including a first bus positive terminal coupled to a first one of a power source and a power load, a first bus negative terminal coupled to the first one of the power source and the power load, and a first bus midpoint terminal. The stacked DC-DC converter includes a second DC bus including a second bus positive terminal coupled to a second one of the power source and the power load, a second bus negative terminal coupled to the second one of the power source and the power load, and a second bus midpoint terminal. The stacked DC-DC converter includes a first half-bridge circuit including a first half-bridge positive terminal coupled to the first bus positive terminal, a first half-bridge negative terminal coupled to the first bus midpoint terminal, and a first half-bridge midpoint terminal. The stacked DC-DC converter includes a second half-bridge circuit including a second half-bridge positive terminal coupled to the first half-bridge negative terminal, a second half-bridge negative terminal coupled to the first bus negative terminal, and a second half-bridge midpoint terminal. The stacked DC-DC converter includes a third half-bridge circuit including a third half-bridge positive terminal coupled to the second bus positive terminal, a third half-bridge negative terminal coupled to the second bus midpoint terminal, and a third half-bridge midpoint terminal. The stacked DC-DC converter includes a fourth half-bridge circuit including a fourth half-bridge positive terminal coupled to the third half-bridge negative terminal, a fourth half-bridge negative terminal coupled to the second bus negative terminal, and a fourth half-bridge midpoint terminal. The stacked DC-DC converter includes a first magnetic element coupling the first half-bridge midpoint terminal to the third half-bridge midpoint terminal and a second magnetic element coupling the second half-bridge midpoint terminal to the fourth half-bridge midpoint terminal.

In some embodiments, the first DC bus includes a first storage element having a first terminal coupled to the first bus positive terminal and a second terminal coupled to the first bus midpoint terminal and a second storage element having a third terminal coupled to the first bus midpoint terminal and a fourth terminal coupled to the first bus negative terminal.

In some embodiments, each of the first storage element and the second storage element is an array of capacitors.

In some embodiments, the first half-bridge circuit includes a first diode having a first diode positive terminal coupled to the first half-bridge positive terminal and a first diode negative terminal coupled to the first half-bridge midpoint terminal. In some embodiments, the first half-bridge circuit includes a second diode having a second diode positive terminal coupled to the first half-bridge midpoint terminal and a second diode negative terminal coupled to the first half-bridge negative terminal. In some embodiments, the first half-bridge circuit includes a first switch having a first switch positive terminal coupled to the first half-bridge positive terminal, a first switch negative terminal coupled to the first half-bridge midpoint terminal, and a first switch control terminal coupled to a first control element. In some embodiments, the first half-bridge circuit includes a second switch having a second switch positive terminal coupled to the first half-bridge midpoint terminal, a second switch negative terminal coupled to the first half-bridge negative terminal, and a second switch control terminal coupled to a second control element.

In some embodiments, each of the first magnetic element and the second magnetic element is an inductor.

In some embodiments, the first bus midpoint terminal is coupled to the second bus midpoint terminal.

In some embodiments, the first bus midpoint terminal is coupled to the second bus midpoint terminal via an inductor.

In some embodiments, the first bus midpoint terminal is coupled to the first one of the power source and the power load, and the first second bus midpoint terminal couples to the second one of the power source and the power load.

Another illustrative embodiment described herein is a converter including a first DC bus including a first capacitive element and a second capacitive element. The first capacitive element includes a first capacitor positive terminal coupled to a first one of a power source and a power load and a first capacitor negative terminal coupled to a first bus midpoint terminal. The second capacitive element includes a second capacitor positive coupled to the first bus midpoint terminal, and a second capacitor negative terminal coupled to the first one of the power source and the power load. The converter includes a second DC bus including a third capacitive element and a fourth capacitive element. The third capacitive element includes a third capacitor positive terminal coupled to a second one of the power source and the power load and a third capacitor negative terminal coupled to a second bus midpoint terminal. The fourth capacitive element includes a fourth capacitor positive coupled to the coupled to the first bus midpoint terminal and a fourth capacitor negative terminal coupled to the second one of the power source and the power load. The converter includes a first stack of half-bridges coupled to the first capacitor positive terminal, the first bus midpoint terminal, and the second capacitor negative terminal of the first DC bus, a second stack of half-bridges coupled to the third capacitor positive terminal, the second bus midpoint terminal, and the fourth capacitor negative terminal of the second DC bus, and a pair of magnetic elements coupling the first stack of half-bridges to the second stack of half-bridges.

In some embodiments, the first stack of half-bridges includes a first half-bridge circuit including a first half-bridge positive terminal coupled to the first capacitor positive terminal, a first half-bridge negative terminal coupled to the first bus midpoint terminal, and a first half-bridge midpoint terminal. The first stack of half-bridges may include a second half-bridge circuit including a second half-bridge positive terminal coupled to the first half-bridge negative terminal, a second half-bridge negative terminal coupled to the second capacitor negative terminal, and a second half-bridge midpoint terminal.

In some embodiments, each of the first capacitive element, the second capacitive element, the third capacitive element, and the fourth capacitive element is an array of capacitors.

In some embodiments, the first half-bridge circuit includes a first diode having a first diode positive terminal coupled to the first half-bridge positive terminal and a first diode negative terminal coupled to the first half-bridge midpoint terminal. In some embodiments, the first half-bridge circuit includes a second diode having a second diode positive terminal coupled to the first half-bridge midpoint terminal and a second diode negative terminal coupled to the first half-bridge negative terminal. In some embodiments, the first half-bridge circuit includes a first switch having a first switch positive terminal coupled to the first half-bridge positive terminal, a first switch negative terminal coupled to the first half-bridge midpoint terminal, and a first switch control terminal coupled to a first control element. In some embodiments, the first half-bridge circuit includes a second switch having a second switch positive terminal coupled to the first half-bridge midpoint terminal, a second switch negative terminal coupled to the first half-bridge negative terminal, and a second switch control terminal coupled to a second control element.

In some embodiments, each magnetic element of the pair of magnetic elements is an inductor.

In some embodiments, the first bus midpoint terminal is coupled to the second bus midpoint terminal.

In some embodiments, the first bus midpoint terminal is coupled to the second bus midpoint terminal via an inductor.

In some embodiments, the first bus midpoint terminal is coupled to the first one of the power source and the power load, and the first second bus midpoint terminal couples to the second one of the power source and the power load.

Another illustrative embodiment described herein is an apparatus including a first DC bus including a first bus positive terminal coupled to a first one of a power source and a power load, a first bus negative terminal coupled to the first one of the power source and the power load, and a first bus midpoint terminal. The apparatus includes a second DC bus including a second bus positive terminal coupled to a second one of the power source and the power load, a second bus negative terminal coupled to the second one of the power source and the power load, and a second bus midpoint terminal. The apparatus includes a first stack of half-bridges coupled to the first bus positive terminal, the first bus midpoint terminal, and the first bus positive negative terminal of the first DC bus, a second stack of half-bridges coupled to the second bus positive terminal, the second bus midpoint terminal, and the second bus positive terminal of the second DC bus, and a pair of magnetic elements coupling the first mirrored stack of half-bridges to the second mirrored stack of half-bridges.

In some embodiments, the first stack of half-bridges includes a first half-bridge circuit including a first half-bridge positive terminal coupled to the first bus positive terminal, a first half-bridge negative terminal coupled to the first bus midpoint terminal, and a first half-bridge midpoint terminal. The first stack of half-bridges may include a second half-bridge circuit including a second half-bridge positive terminal coupled to the first half-bridge negative terminal, a second half-bridge negative terminal coupled to the first bus negative terminal, and a second half-bridge midpoint terminal.

In some embodiments, each magnetic element of the pair of magnetic elements is an inductor.

In some embodiments, the first bus midpoint terminal is coupled to the second bus midpoint terminal.

BRIEF DESCRIPTION OF THE DRAWINGS

FIG. 2A is an illustration of a buck mode charge phase of the DC-DC converter as shown in FIG. 1A, according to an exemplary embodiment.

FIG. 2C is an illustration of a boost mode charge phase of the DC-DC converter as shown in FIG. 1A, according to an exemplary embodiment.

DESCRIPTION OF EXAMPLE EMBODIMENTS

Figure 1A:
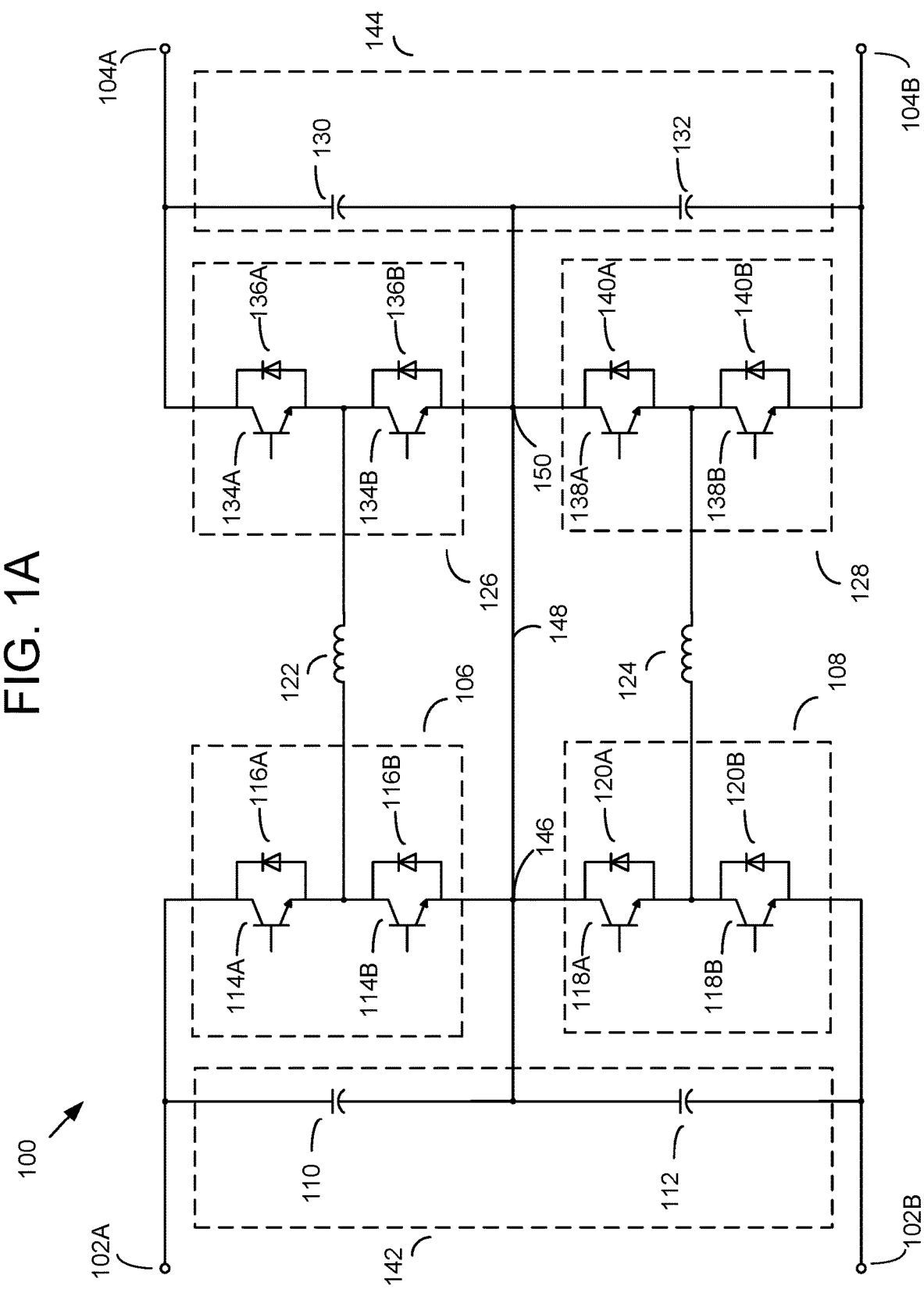
FIG. 1A is a block diagram of a DC-DC converter, according to an exemplary embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Disclosed herein is a mirrored stack of dual, bi-directional, non-isolated half-bridge pairs with separate DC busses. Advantageously, the disclosure provides a means for converting a first DC voltage to a second DC voltage. This is, at least in part, possible because of separate DC busses for input and output terminals. Another advantage of the disclosure is that the voltage handling capability is twice the voltage handling capability of a non-stacked half-bridge topology. Enabling a connection of higher voltage sources and loads can lead to an increase in power transfer or a reduction in current, which leads to higher power efficiency. Finally, the disclosure includes embodiments that are cost-effective for DC-DC conversion. For example, a non-isolated topology avoids using bulky, expensive transformers for magnetically coupling a DC-DC converter.

FIG. 1A is a block diagram of a DC-DC converter 100, according to an exemplary embodiment. The DC-DC converter 100 includes a positive input terminal 102A and a negative input terminal 102B (herein collectively referred to as "input terminals 102"). In some embodiments, a power source is connected across the input terminals 102. The power source may be a solar panel, a wind turbine, a fuel cell, an alternator, a battery, an adapter, or any instrument that generates a voltage. The DC-DC converter 100 further includes a positive output terminal 104A and a negative output terminal 104B (herein collectively referred to as "output terminals 104"). In some embodiments, a load is connected across the output terminals 104. The load may be an inverter, a battery, a capacitor, a superconducting magnetic energy storage (SMES), or any suitable element that stores or converts DC power. In some embodiments, the load may be connected across the input terminals 102 and the power source may be connected across the output terminals 104. In some embodiments, a first voltage across the input terminals 102 may be higher than a second voltage across the output terminals 104. In some embodiments, the first may be lower than the second voltage. In some embodiments, the first voltage may be same or substantially same as the second voltage.

The DC-DC converter 100 further includes a capacitor 110 and a capacitor 112 (herein collectively referred to as "a DC bus 142"). The capacitor 110 has a first terminal coupled to the positive input terminal 102A and a second terminal. The capacitor 112 has a first terminal coupled to the second terminal of the capacitor 110 (herein referred to as "a primary midpoint node 146"). The capacitor 112 has a second terminal coupled to the negative input terminal 102B. In some embodiments, capacitance values of the capacitor 110 and the capacitor 112 are the same or substantially the same. The capacitors 110 and 112 may be configured balance a voltage across the input terminals 102 such that a first fraction of the voltage from the input positive terminal 102A to the primary midpoint node 146 may be equal or substantially equal to a second fraction of the voltage from the primary midpoint node 146 to the input negative terminal. Each of the capacitors 110 and 112 may be individual capacitors or multiple capacitors in parallel.

The DC-DC converter 100 further includes a switch 114A, a switch 114B, a diode 116A, and a diode 116B (herein collectively referred to as "a half-bridge 106"). The switch 114A has a first terminal coupling to the positive input terminal 102A, a second terminal, and a third terminal receiving a first control signal. The switch 114B has a first terminal coupling to the second terminal of the switch 114A (herein referred to as "a midpoint node of the half-bridge 106"), a second terminal coupling to the primary midpoint node 146, and a third terminal receiving a second control signal. The diode 116A has a first terminal coupled to the positive input terminal 102A and a second terminal coupled to the midpoint node of the half-bridge 106. The diode 114B has a first terminal coupled to the midpoint node of the half-bridge 106 and a second terminal coupled to the primary midpoint node 146.

The DC-DC converter 100 further includes a switch 118A, a switch 118B, a diode 120A, and a diode 120B (herein collectively referred to as "a half-bridge 108"), each of the switches 118A and 118B having first, second, and third terminals, and each of the diodes 120A and 120B having first and second terminals. The half-bridge 108 has a midpoint node of the half-bridge 108. The half-bridge 108 has a similar configuration as the half-bridge 106 except that the first terminals of the switch 118A and the diode 120A couple to the primary midpoint node 146, the second terminals of the switch 118A and the diode 120A (and first terminals of the switch 118B and the diode 120B) couple to the midpoint node of the half-bridge 108, the second terminals of the switch 118B and the diode 120B couple to the negative input terminal 102B, and the third terminals of the switches 118A and 118B receive a third control signal and a fourth control signal, respectively.

The DC-DC converter 100 further includes an inductor 122, an inductor 124, and a connection 148. The inductor 122 has a first terminal coupled to the midpoint node of the half-bridge 106 and a second terminal. The inductor 124 has a first terminal coupled to the midpoint of the half-bridge 108 and a second terminal. The connection 148 couples the primary midpoint node 146 to a secondary midpoint node 150.

The DC-DC converter 100 further includes a switch 134A, a switch 134B, a diode 136A, and a diode 136B (herein collectively referred to as "a half-bridge 126"), each of the switches 134A and 134B having first, second, and third terminals, and each of the diodes 136A and 136B having first and second terminals. The half-bridge 126 has a midpoint node of the half-bridge 126 coupled to the second terminal of the inductor 122. The half-bridge 126 has a similar configuration as the half-bridge 106 except that the first terminals of the switch 134A and the diode 136A couple to the positive output terminal 104A, the second terminals of the switch 134A and the diode 136A (and the first terminals of the switch 134B and the diode 136B) couple to the midpoint node of the half-bridge 126, the second terminals of the switch 134B and the diode 136B couple to the secondary midpoint node 150, and the third terminals of the switches 134A and 136B receive a fifth control signal and a sixth control signal, respectively.

The DC-DC converter 100 further includes a switch 138A, a switch 138B, a diode 140A, and a diode 140B (herein collectively referred to as "a half-bridge 128"), each of the switches 138A and 138B having first, second, and third terminals, and each of the diodes 140A and 140B having first and second terminals. The half-bridge 128 has a midpoint node of the half-bridge 128 coupled to the second terminal of the inductor 124. The half-bridge 128 has a similar configuration as the half-bridge 106 except that the first terminals of the switch 138A and the diode 140A couple to the secondary midpoint node 150, the second terminals of the switch 138A and the diode 140A (and the first terminals of the switch 138B and the diode 140B) couple to a midpoint node of the half-bridge 128, the second terminals of the switch 138B and the diode 140B couple to the negative input terminal 102B, and the third terminals of the switches 138A and 140B receive a seventh control signal and an eighth control signal, respectively.

The DC-DC converter 100 further includes a capacitor 130 and a capacitor 132 (herein collectively referred to as "a dc bus 144"), each of the capacitors 130 and 132 having a first and second terminal. The dc bus 144 has a similar configuration as the dc bus 142 except that the first terminal of capacitor 130 is coupled to the positive output terminal 104A and the second terminal of the capacitor 112 is coupled to the negative output terminal 104B.

A capacitor, as described herein (e.g. the capacitors 110, 112, 130, and 132), is an energy storage element that stores electrical energy in an electric field. A capacitor may be an electrolytic capacitor, a super capacitor, a variable capacitor, a trimmer capacitor, a ceramic capacitor, a power film capacitor, a polypropylene capacitor, polycarbonate capacitor, a silver mica capacitor, an integrated circuit (IC) capacitor, a metal oxide metal (MOM) capacitor, a metal insulator metal (MIM) capacitor, a metal oxide semiconductor (MOS) capacitor, a double-layer capacitor, a pseudo-capacitor, a hybrid capacitor, two conductive plates surrounding a dielectric, the like, or a combination thereof.

A switch as described herein (e.g. the switches 114A, 114B, 118A, 118B, 134A, 134B, 138A, 138B), is a device whose conductivity between the first and the second terminals is affected by a signal level of a control signal applied at the third terminal. In some embodiments, in response to the control signal having a signal level above a pre-defined threshold, the first and the second terminals of the switch conductively couple to each other. In response to the control signal having a signal level below a second pre-defined threshold, the first and the second terminals of the switch may be isolated from each other (i.e. they are not conductively coupling to each other). In some embodiments, in response to the control signal having the signal level above the pre-defined threshold, the first and the second terminals of the switch are isolated from each other. In response to the control signal having the signal level below the second pre-defined threshold, the first and the second terminals of the switch may be conductively coupled to each other. A switch that is said to be conductively coupling between its first and second terminal is herein referred to as being "on." A switch that is said to be isolated between its first and second terminal is herein referred to as being "off." The switch may be an IC switch, a MOS field effect transistors (MOSFET), an n-channel MOSFET (NMOS), a p-channel MOSFET (PMOS), a complementary MOSFET (CMOS), a metal-semiconductor FET (MESFET), a junction gate FET (JFET), a bipolar junction transistor (BJT), an n-type p-type n-type (NPN) BJT, a p-type n-type p-type (PNP) BJT, a micro-electro-mechanical system (MEMS), a single-pole, single-throw (SPST) switch, a single-pole, double-throw (SPDT) switch, the like, or a combination thereof. Although switches with three terminals are described herein, a number of terminals of the switches can be more or less than three without departing from the scope of the present disclosure.

A control signal, as described herein (e.g. the first control signal, the second control signal, the third control signal, the fourth control signal, the fifth control signal, the sixth control signal, the seventh control signal, and the eight control signal) is a signal provided to the switch to control the operation of the switch as described in the preceding paragraph. The control signal may be a voltage, a current, a power, a resistance, a capacitance, an electromagnetic wave, a light, a pressure, a temperature, or the like. In some embodiments, the control signals are provided by one or more control elements. The control element can be an IC, an arithmetic-logic unit (ALU), a microprocessor, a digital signal processor (DSP), a computer processor (CPU), the like, or a combination thereof. In some embodiments, each of the control signals is an independent control signal (i.e. its signal level does not depend on the signal level of any other control signal).

A diode, as described herein (e.g. the diodes 116A, 116B, 120A, 120B, 136A, 136B, 140A, 140B), is a two-terminal device that conducts current primarily in one direction. The diode may be a p-type n-type (PN) junction diode, an insulated-gate bipolar transistor (IGBT) diode, a Schottky diode, a Zener diode, a light emitting diode (LED), a photodiode, a small signal switching diode, the like, or any combination thereof. In some embodiments, each of the diodes may be integrated with a corresponding switch that is anti-parallel with the diode (e.g. the diode 116A may be integrated with the switch 114A).

An inductor, as described herein (e.g. the inductors 122, 124), is an energy storage element that stores electrical energy in a magnetic field when electric current flows from its first terminal to its second terminal. An inductor may be an IC inductor, an air core inductor, a coil inductor, a ferromagnetic core inductor, a laminated core inductor, a ferrite-core inductor, a toroidal core inductor, a variable inductor, a spiral inductor, a multi-layer inductor, a wire with parasitic inductance, the like, or a combination thereof.

Figure 1B:
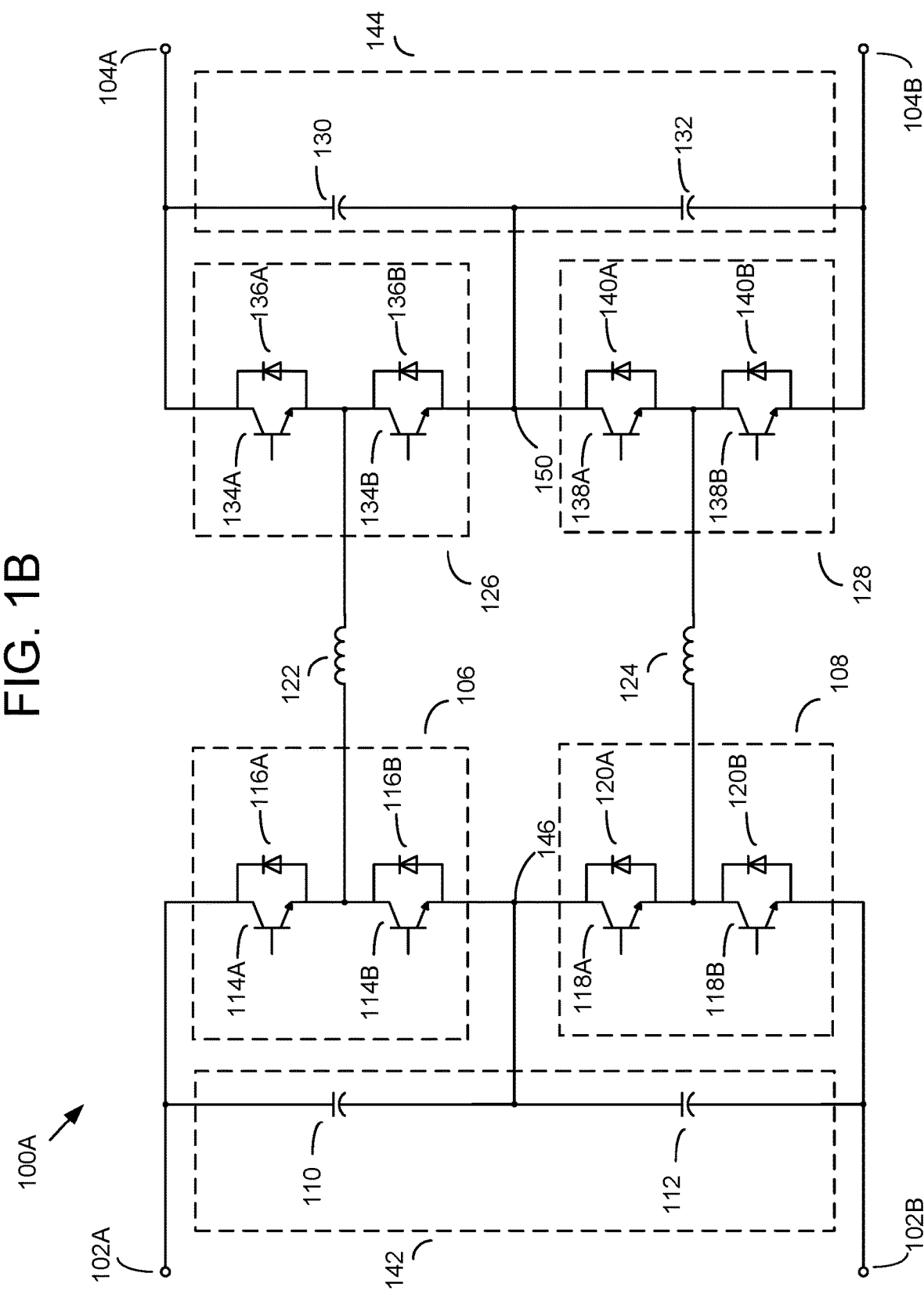
FIG. 1B is a block diagram of a DC-DC converter, according to an exemplary embodiment.

FIG. 1B is a block diagram of a DC-DC converter 100A, according to an exemplary embodiment. The DC-DC converter 100A is similar to the dc-dc converter 100 except that the connection 148 is omitted.

Figure 1C:
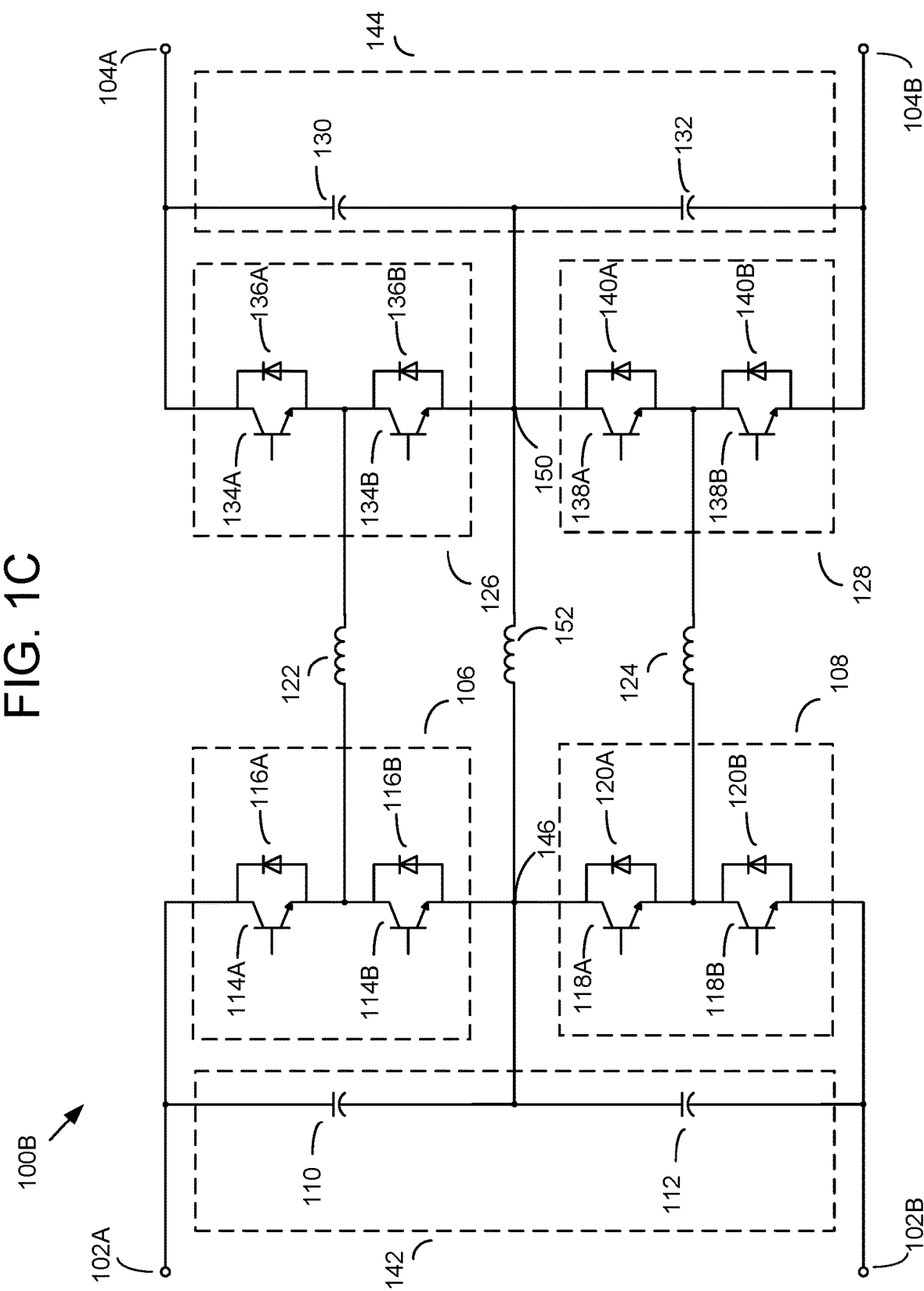
FIG. 1C is a block diagram of a DC-DC converter, according to an exemplary embodiment.

FIG. 1C is a block diagram of a DC-DC converter 100B, according to an exemplary embodiment. The DC-DC converter 100B is similar to the dc-dc converter 100 except, instead of the connection 148, the DC-DC converter 100B includes inductor 152 having a first terminal and a second terminal. The first terminal couples to the primary midpoint node 146 and the second terminal couples to the secondary midpoint node 150.

Figure 1D:
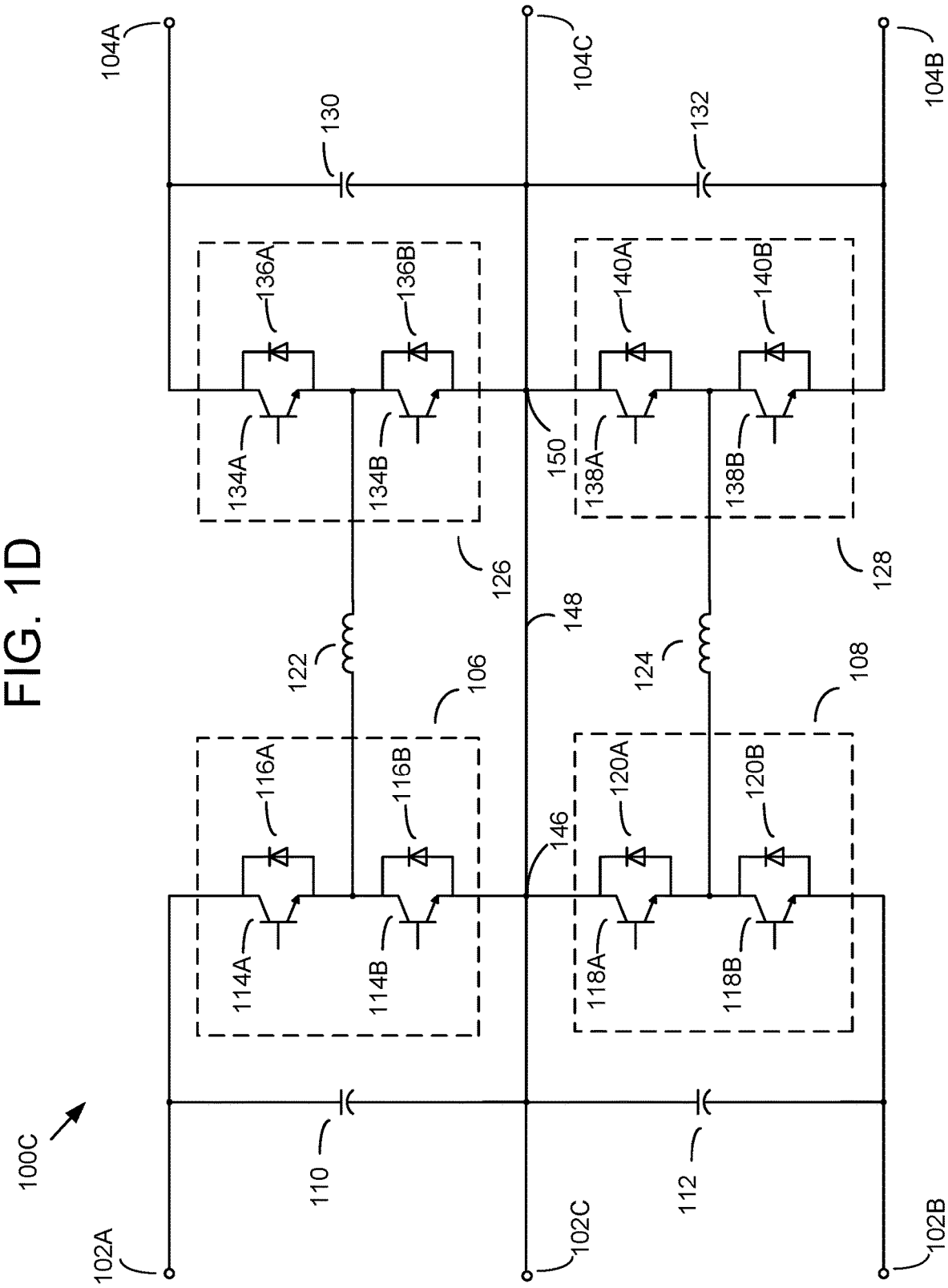
FIG. 1D is a block diagram of a DC-DC converter, according to an exemplary embodiment.

FIG. 1D is a block diagram of a DC-DC converter 100C, according to an exemplary embodiment. The DC-DC converter 100C is similar to the dc-dc converter 100 except that the input terminals 102 may include a third terminal 102C connected to the primary midpoint node 146 and/or the output terminals 104 include a third terminal 104C connected to the secondary midpoint node 150. Thus, the input terminals 102 and/or the output terminals 104 can interface with a battery stack or a solar array. In some embodiments, the connection 148 may be omitted. In some embodiments, instead of the connection 148, the DC-DC converter 100B includes the inductor 152 having the first terminal coupled to the primary midpoint node 146 and the second terminal coupled o the secondary midpoint node 150.

FIG. 2A is an illustration of a buck mode charge phase of the DC-DC converter 100 as shown in FIG. 1A, according to an exemplary embodiment. During the buck mode charge phase, power is transferred from first terminals having a high voltage to second terminals having a low voltage lower than the high voltage. Although FIG. 2A depicts the input terminals 102 having the high voltage and the output terminals 104 having the low voltage, the high voltage and the low voltage can be swapped (and the states of the corresponding switches, e.g. 114A and 134A, swapped accordingly) without departing from the scope of the present disclosure. During the buck mode charge phase, the switches 114A, 118B, 134A, and 138B are on, while the switches 114B, 118A, 134B, and 138A are off. A current 202 flows from the positive input terminal 102A to the positive output terminal 104A through the switch 114A, the inductor 122, and at least one of the switch 134A and the diode 136A. The first current 202 goes up linearly versus time and a first voltage with a first polarity is maintained across the inductor 122. A second current 204 flows from the negative output terminal 104B to the negative input terminal 102B through at least one of the switch 138B and the diode 140B, the inductor 124, and the switch 118B. The second current 204 goes up linearly versus time and a second voltage with a second polarity is maintained across the inductor 124.

Figure 2B:
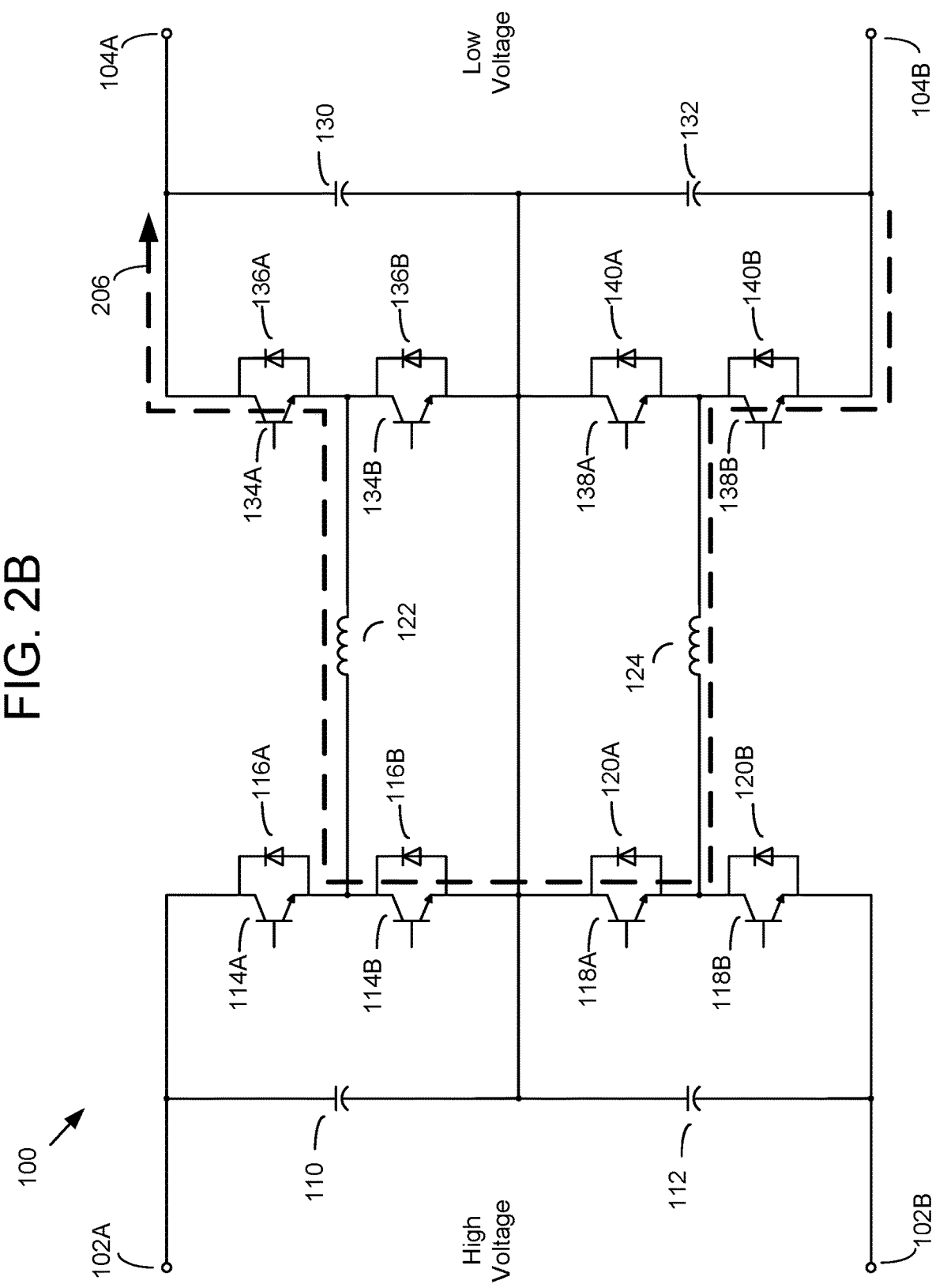
FIG. 2B is an illustration of a buck mode discharge phase of the DC-DC converter as shown in FIG. 1A, according to an exemplary embodiment.

FIG. 2B is an illustration of a buck mode discharge phase of the DC-DC converter 100 as shown in FIG. 1A, according to an exemplary embodiment. The buck mode discharge phase is similar to the buck mode charge phase except that the switches 114A and 118B are turned off. In order to maintain the first current 202 through the inductor 122 and the second current 204 through inductor 124, a current 206 flows from the negative output terminal 104B to the positive output terminal 104A through at least one of the switch 138B and the diode 140B, the inductor 124, the diode 120A, the diode 116B, the inductor 122, and at least one of the switch 134A and the diode 136A. The current 206 goes down linearly versus time, and, upon entering the buck mode discharge phase, the first polarity of the first voltage across the inductor 122 and the second voltage across the inductor 124 are flipped. A sum of a time period of the buck mode charge phase and a time period of the buck mode discharge phase is referred to herein as a buck mode switching period. A first duty cycle may be determined as a ratio of a time of the buck mode time period of the buck mode charge phase and the buck mode switching period. The low voltage across the output terminals 104 may be determined as a product of the high voltage across the input terminals 102 and the first duty cycle.

FIG. 2C is an illustration of a boost mode charge phase of the DC-DC converter as shown in FIG. 1A, according to an exemplary embodiment. During the boost mode charge phase, power is transferred from first terminals having a low voltage to second terminals having a high voltage higher than the low voltage. Although FIG. 2B depicts the input terminals 102 having the low voltage and the output terminals 104 having the high voltage, the high voltage and the low voltage can be swapped (and the states of the corresponding switches, e.g. 114A and 134A, swapped accordingly) without departing from the scope of the present disclosure. During the boost mode charge phase, the switches 114A, 118B, 134B, and 138A are on, while the switches 114B, 118A, 134A, and 138B are off. A current 210 flows from the positive input terminal 102A to the negative input terminal 102B through the switch 114A, the inductor 122, the switch 134B, the switch 138A, the inductor 124, and the switch 118B. The current 210 goes up linearly versus time, a third voltage with a third polarity is maintained across the inductor 122, and a fourth voltage with a fourth polarity is maintained across the inductor 124.

Figure 2D:
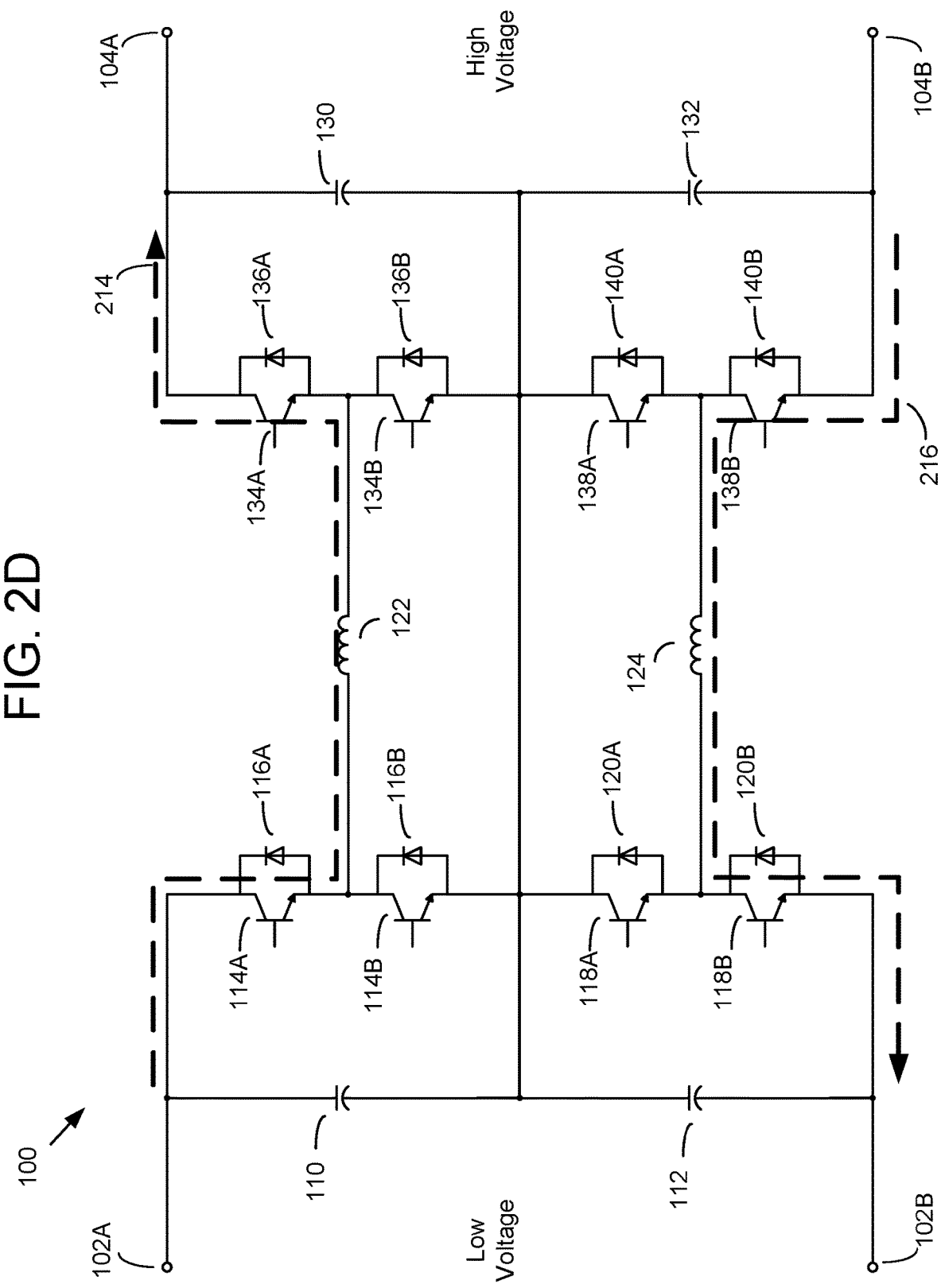
FIG. 2D is an illustration of a boost mode discharge phase of the DC-DC converter as shown in FIG. 1A, according to an exemplary embodiment.

FIG. 2D is an illustration of a boost mode discharge phase of the DC-DC converter 100 as shown in FIG. 1A, according to an exemplary embodiment. The boost mode discharge phase is similar to the boost mode charge phase except that the switches 134B and 138A are turned off. In order to maintain the current 210 through the inductor 122, a first current 214 flows from the positive input terminal 102A to the positive output terminal 104A through the switch 114A, the inductor 122, and the diode 136A. The first current 214 goes down linearly versus time, and, upon entering the boost mode discharge phase, the third polarity of the third voltage across the inductor 122 is flipped. In order to maintain the current 210 through the inductor 124, a second current 216 flows from the negative output terminal 104B to the negative input terminal 102B through the diode 140B, the inductor 124, and the switch 118B. The second current 216 goes down linearly versus time, and, upon entering the boost mode discharge phase, the fourth polarity of the fourth voltage across the inductor 124 is flipped. A sum of a time period of the boost mode charge phase and a time period of the boost mode discharge phase is referred to herein as a boost mode switching period. A second duty cycle may be determined as a ratio of the time period of the boost mode charge phase and the switching period. The high voltage across the output terminals 104 may be determined as a ratio of the low voltage across the input terminals 102 and a difference of one and the second duty cycle.

In some embodiments, the DC-DC converter 100 also has a buck-boost mode. The buck-boost mode combines the boost mode charge phase depicted in FIG. 2C and the buck mode discharge phase depicted in FIG. 2B. A voltage across the output terminals 104 may be determined as a product of a voltage across the input terminals 102 and a ratio of the first duty cycle and the difference of one and the second duty cycle. In buck-boost mode, the voltage across the output terminals 104 may be higher, lower, or same as the voltage across the input terminals 102. The second duty cycle may be different from the first duty cycle.

In some embodiments, the switching period (e.g. the buck mode switching period or boost mode switching period) may be a sum of a time of the charge phase (e.g. the buck mode charge phase or the boost mode charge phase), a time of the discharge phase (e.g. the buck mode discharge phase or the boost mode discharge phase), and a dead-time phase. The dead-time phase may be a time during which two switches in a same half-bridge that are switching between the charge phase and the discharge phase are simultaneously turned off (e.g. switches 114A and 114B in buck mode, with reference to FIG. 2A and FIG. 2B). The dead-time phase may prevent the two switches in the same half-bridge from turning on at a same time. Turning on at the same time would thereby short one of the terminals 102A, 102B, 104A, or 104B to the midpoint of the DC-DC converter 100.

What is claimed is:

1. A stacked direct current to direct current (DC-DC) converter comprising:
   a first DC bus including a first bus positive terminal coupled to a first one of a power source, a first bus negative terminal coupled to a second power source, and a first bus midpoint terminal directly connected to the first power source and the second power source;
   a second DC bus including a second bus positive terminal coupled to a first power load, a second bus negative terminal coupled to a second power load, and a second bus midpoint terminal directly connected to the first power load and the second power load;
   a first half-bridge circuit including a first half-bridge positive terminal coupled to the first bus positive terminal, a first half-bridge negative terminal coupled to the first bus midpoint terminal, and a first half-bridge midpoint terminal;
   a second half-bridge circuit including a second half-bridge positive terminal coupled to the first half-bridge negative terminal, a second half-bridge negative terminal coupled to the first bus negative terminal, and a second half-bridge midpoint terminal;
   a third half-bridge circuit including a third half-bridge positive terminal coupled to the second bus positive terminal, a third half-bridge negative terminal coupled to the second bus midpoint terminal, and a third half-bridge midpoint terminal;

a fourth half-bridge circuit including a fourth half-bridge positive terminal coupled to the third half-bridge negative terminal, a fourth half-bridge negative terminal coupled to the second bus negative terminal, and a fourth half-bridge midpoint terminal;

a first magnetic element coupling the first half-bridge midpoint terminal to the third half-bridge midpoint terminal; and a second magnetic element coupling the second half-bridge midpoint terminal to the fourth half-bridge midpoint terminal.

2. The DC-DC converter of claim 1, wherein the first DC bus includes:

a first storage element having a first terminal coupled to the first bus positive terminal and a second terminal coupled to the first bus midpoint terminal; and a second storage element having a third terminal coupled to the first bus midpoint terminal and a fourth terminal coupled to the first bus negative terminal.

3. The DC-DC converter of claim 2, wherein each of the first storage element and the second storage element is an array of capacitors.

4. The DC-DC converter of claim 1, wherein the first half-bridge circuit includes:

a first diode having a first diode positive terminal coupled to the first half-bridge positive terminal and a first diode negative terminal coupled to the first half-bridge midpoint terminal;

a second diode having a second diode positive terminal coupled to the first half-bridge midpoint terminal and a second diode negative terminal coupled to the first half-bridge negative terminal;

a first switch having a first switch positive terminal coupled to the first half-bridge positive terminal, a first switch negative terminal coupled to the first half-bridge midpoint terminal, and a first switch control terminal coupled to a first control element; and a second switch having a second switch positive terminal coupled to the first half-bridge midpoint terminal, a second switch negative terminal coupled to the first half-bridge negative terminal, and a second switch control terminal coupled to a second control element.

5. The DC-DC converter of claim 1, wherein each of the first magnetic element and the second magnetic element is an inductor.

6. The DC-DC converter of claim 1, wherein the first bus midpoint terminal is coupled to the second bus midpoint terminal.

7. The DC-DC converter of claim 1, wherein the first bus midpoint terminal is coupled to the second bus midpoint terminal via an inductor.

8. A converter comprising:

a first DC bus including a first capacitive element and a second capacitive element, wherein the first capacitive element includes a first capacitor positive terminal coupled to a first power source and a first capacitor negative terminal coupled to a first bus midpoint terminal, and wherein the second capacitive element includes a second capacitor positive terminal coupled to the first bus midpoint terminal, and a second capacitor negative terminal coupled to a second power source, wherein the first bus midpoint terminal is directly connected to the first power source and the second power source;

a second DC bus including a third capacitive element and a fourth capacitive element, wherein the third capacitive element includes a third capacitor positive terminal coupled to a first power load and a third capacitor negative terminal coupled to a second bus midpoint terminal, and wherein the fourth capacitive element includes a fourth capacitor positive terminal coupled to the first bus midpoint terminal and a fourth capacitor negative terminal coupled to a second power load, wherein the second bus midpoint terminal is directly connected to the first power load and the second power load;

a first stack of half-bridges coupled to the first capacitor positive terminal, the first bus midpoint terminal, and the second capacitor negative terminal of the first DC bus;

a second stack of half-bridges coupled to the third capacitor positive terminal, the second bus midpoint terminal, and the fourth capacitor negative terminal of the second DC bus; and a pair of magnetic elements coupling the first stack of half-bridges to the second stack of half-bridges.

9. The converter of claim 8, wherein the first stack of half-bridges includes:

a first half-bridge circuit including a first half-bridge positive terminal coupled to the first capacitor positive terminal, a first half-bridge negative terminal coupled to the first bus midpoint terminal, and a first half-bridge midpoint terminal; and a second half-bridge circuit including a second half-bridge positive terminal coupled to the first half-bridge negative terminal, a second half-bridge negative terminal coupled to the second capacitor negative terminal, and a second half-bridge midpoint terminal.

10. The converter of claim 8, wherein each of the first capacitive element, the second capacitive element, the third capacitive element, and the fourth capacitive element is an array of capacitors.

11. The converter of claim 8, wherein the first half-bridge circuit includes:

a first diode having a first diode positive terminal coupled to the first half-bridge positive terminal and a first diode negative terminal coupled to the first half-bridge midpoint terminal;

a second diode having a second diode positive terminal coupled to the first half-bridge midpoint terminal and a second diode negative terminal coupled to the first half-bridge negative terminal;

a first switch having a first switch positive terminal coupled to the first half-bridge positive terminal, a first switch negative terminal coupled to the first half-bridge midpoint terminal, and a first switch control terminal coupled to a first control element; and a second switch having a second switch positive terminal coupled to the first half-bridge midpoint terminal, a second switch negative terminal coupled to the first half-bridge negative terminal, and a second switch control terminal coupled to a second control element.

12. The converter of claim 8, wherein each magnetic element of the pair of magnetic elements is an inductor.

13. The converter of claim 8, wherein the first bus midpoint terminal is coupled to the second bus midpoint terminal.

14. The converter of claim 8, wherein the first bus midpoint terminal is coupled to the second bus midpoint terminal via an inductor.

15. An apparatus comprising:

a first DC bus including a first bus positive terminal coupled to a first one of a power source, a first bus negative terminal coupled to a second power source, and a first bus midpoint terminal directly connected to the first power source and the second power source;

a second DC bus including a second bus positive terminal coupled to a first power load, a second bus negative terminal coupled to a second power load, and a second bus midpoint terminal directly connected to the first power load and the second power load;

a first stack of half-bridges coupled to the first bus positive terminal, the first bus midpoint terminal, and the first bus positive negative terminal of the first DC bus;

a second stack of half-bridges coupled to the second bus positive terminal, the second bus midpoint terminal, and the second bus positive terminal of the second DC bus; and a pair of magnetic elements coupling the first mirrored stack of half-bridges to the second mirrored stack of half-bridges.

16. The apparatus of claim 15, wherein the first stack of half-bridges includes:
   a first half-bridge circuit including a first half-bridge positive terminal coupled to the first bus positive terminal, a first half-bridge negative terminal coupled to the first bus midpoint terminal, and a first half-bridge midpoint terminal; and
   a second half-bridge circuit including a second half-bridge positive terminal coupled to the first half-bridge negative terminal, a second half-bridge negative terminal coupled to the first bus negative terminal, and a second half-bridge midpoint terminal.

17. The apparatus of claim 15, wherein each magnetic element of the pair of magnetic elements is an inductor.

18. The apparatus of claim 15, wherein the first bus midpoint terminal is coupled to the second bus midpoint terminal.

* * * * *